United States Patent
Kim et al.

(10) Patent No.: US 10,819,333 B2
(45) Date of Patent: Oct. 27, 2020

(54) TIMING CONTROLLER RESETTING CIRCUIT AND A DISPLAY DEVICE INCLUDING THE SAME

(71) Applicant: SAMSUNG DISPLAY CO., LTD., Yongin-si, Gyeonggi-do (KR)

(72) Inventors: Ga-Na Kim, Icheon-si (KR); Po-Yun Park, Seoul (KR); Hong-Kyu Kim, Suwon-si (KR); Myeongsu Kim, Hwaseong-si (KR); Dongwon Park, Asan-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 16/260,346

(22) Filed: Jan. 29, 2019

(65) Prior Publication Data

US 2019/0253048 A1 Aug. 15, 2019

(30) Foreign Application Priority Data

Feb. 14, 2018 (KR) .......................... 10-2018-0018389

(51) Int. Cl.
*H03K 17/22* (2006.01)
*G09G 5/18* (2006.01)

(52) U.S. Cl.
CPC .............. *H03K 17/22* (2013.01); *G09G 5/18* (2013.01); *G09G 2330/026* (2013.01)

(58) Field of Classification Search
CPC .... G06F 1/00; G06F 1/24; G11C 5/00; G11C 5/143; G09G 2330/00; G09G 2330/026;
(Continued)

(56) References Cited

U.S. PATENT DOCUMENTS

| 7,256,778 B1 * | 8/2007 | Choi ................. G09G 3/3611 327/143 |
| 2006/0001639 A1 * | 1/2006 | Chen ................. G09G 3/3677 345/100 |

(Continued)

FOREIGN PATENT DOCUMENTS

| KR | 10-2004-0056170 | 6/2004 |
| KR | 10-2009-0058359 | 6/2009 |
| KR | 10-2012-0098731 | 9/2012 |

*Primary Examiner* — Lincoln D Donovan
*Assistant Examiner* — Dave Mattison
(74) *Attorney, Agent, or Firm* — F. Chau & Associates, LLC

(57) ABSTRACT

A timing controller resetting circuit including: a resistor connected to an output node from which a reset signal is output and a first voltage source which supplies a first voltage; a capacitor connected to the output node and a second voltage source which supplies a second voltage that is lower than the first voltage; a reference voltage source configured to generate a reference voltage that is lower than the first voltage and higher than the second voltage; a comparator including a first input terminal which receives the first voltage, a second input terminal which receives the reference voltage, and an output terminal which outputs a comparison result signal generated by comparing the first voltage with the reference voltage; and a transistor including a first terminal which is connected to the output node, a second terminal which receives the second voltage, and a gate terminal which receives the comparison result signal.

20 Claims, 10 Drawing Sheets

(58) Field of Classification Search
CPC .......... G09G 5/18; H03K 17/00; H03K 17/22; H03K 17/223; H03K 3/00; H03K 3/356008
USPC ........................................................ 327/143
See application file for complete search history.

(56) References Cited

U.S. PATENT DOCUMENTS

2013/0222352 A1* 8/2013 Jeong .................. G09G 3/3266
 345/205
2014/0062584 A1* 3/2014 Kim ....................... G05F 1/563
 327/541

* cited by examiner

TIMING CONTROLLER RESETTING CIRCUIT AND A DISPLAY DEVICE INCLUDING THE SAME

CROSS-REFERENCE TO RELATED APPLICATION

This application claims priority under 35 U.S.C. § 119 to Korean Patent Application No. 10-2018-0018389, filed on Feb. 14, 2018 in the Korean Intellectual Property Office (KIPO), the disclosure of which is incorporated by reference herein in its entirety.

1. TECHNICAL FIELD

Exemplary embodiments of the present inventive concept relate to a display device. More particularly, exemplary embodiments of the present inventive concept relate to a timing controller resetting circuit that provides a reset signal to a timing controller and a display device including the timing controller resetting circuit.

2. DESCRIPTION OF THE RELATED ART

A display device typically includes a display panel including a plurality of pixel circuits, a scan driver that provides a scan signal to the pixel circuits, a data driver that provides a data signal to the pixel circuits, a timing controller that generates control signals for controlling the scan driver and the data driver, etc. Generally, the timing controller operates based on a reset signal. A timing controller resetting circuit generates the reset signal and provides the reset signal to the timing controller. For example, the timing controller operates after the reset signal switches from a low voltage level to a high voltage level as a power source is turned on. When this is the case, the timing controller does not operate after the reset signal switches from the high voltage level to the low voltage level as the power source is turned off.

The timing controller resetting circuit generates the reset signal based on a source voltage output from the power source. To accomplish this, the timing controller resetting circuit includes a resister and a capacitor connected in series between the source voltage and a ground voltage. In other words, the timing controller resetting circuit includes an RC circuit. In this case, the reset signal is generated by an RC delay of the source voltage output from the power source. Thus, when the power source is repeatedly turned on and off in a short amount of time, the reset signal begins to switch to a high voltage level before having a low voltage level sufficient to be recognized as a low voltage level. In addition, the reset signal begins to switch to the low voltage level before having the high voltage level sufficient to be recognized as a high voltage level.

Thus, in a conventional display device, when the power source is repeatedly turned on and off in a short amount of time, the timing controller may erroneously recognize the reset signal. This is referred to as a reset signal recognition failure of the timing controller. As a result, the conventional display device may malfunction due to the reset signal recognition failure of the timing controller.

SUMMARY

According to exemplary embodiments of the present inventive concept, a timing controller resetting circuit may include a resistor connected to an output node from which a reset signal is output and a first voltage source which supplies a first voltage, a capacitor connected to the output node and a second voltage source which supplies a second voltage that is lower than the first voltage, a reference voltage source configured to generate a reference voltage that is lower than the first voltage and higher than the second voltage, a comparator including a first input terminal which receives the first voltage, a second input terminal which receives the reference voltage, and an output terminal which outputs a comparison result signal generated by comparing the first voltage with the reference voltage, and a transistor including a first terminal which is connected to the output node, a second terminal which receives the second voltage, and a gate terminal which receives the comparison result signal.

In exemplary embodiments of the present inventive concept, the first voltage may be a source voltage which is supplied from a power source, and the second voltage may be a ground voltage which is supplied from a ground source.

In exemplary embodiments of the present inventive concept, the first input terminal of the comparator may be a negative input terminal, the second input terminal of the comparator may be a positive input terminal, and the transistor may be an n-channel metal oxide semiconductor (NMOS) transistor.

In exemplary embodiments of the present inventive concept, the comparison result signal may have a low voltage level when the first voltage is higher than the reference voltage, and the transistor may be turned off when the comparison result signal has the low voltage level.

In exemplary embodiments of the present inventive concept, the comparison result signal may have a high voltage level when the first voltage is lower than the reference voltage, and the transistor may be turned on when the comparison result signal has the high voltage level.

In exemplary embodiments of the present inventive concept, the first input terminal of the comparator may be a positive input terminal, the second input terminal of the comparator may be a negative input terminal, and the transistor may be a p-channel metal oxide semiconductor (PMOS) transistor.

In exemplary embodiments of the present inventive concept, the comparison result signal may have a high voltage level when the first voltage is higher than the reference voltage, and the transistor may be turned off when the comparison result signal has the high voltage level.

In exemplary embodiments of the present inventive concept, the comparison result signal may have a low voltage level when the first voltage is lower than the reference voltage, and the transistor may be turned on when the comparison result signal has the low voltage level.

According to exemplary embodiments of the present inventive concept, a timing controller resetting circuit may include a resistor connected to an output node from which a reset signal is output and a first voltage source which supplies a first voltage, a capacitor connected to the output node and a second voltage source which supplies a second voltage that is lower than the first voltage, a comparator including a first input terminal which receives the first voltage, a second input terminal which receives a reference voltage that is lower than the first voltage and higher than the second voltage, and an output terminal which outputs a comparison result signal generated by comparing the first voltage with the reference voltage, and a transistor including a first terminal which is connected to the output node, a second terminal which receives the second voltage, and a gate terminal which receives the comparison result signal.

In exemplary embodiments of the present inventive concept, the first voltage may be a source voltage which is supplied from a power source, and the second voltage may be a ground voltage which is supplied from a ground source.

In exemplary embodiments of the present inventive concept, the first input terminal of the comparator may be a negative input terminal, the second input terminal of the comparator may be a positive input terminal, and the transistor may be an NMOS transistor.

In exemplary embodiments of the present inventive concept, the comparison result signal may have a low voltage level when the first voltage is higher than the reference voltage, and the transistor may be turned off when the comparison result signal has the low voltage level.

In exemplary embodiments of the present inventive concept, the comparison result signal may have a high voltage level when the first voltage is lower than the reference voltage, and the transistor may be turned on when the comparison result signal has the high voltage level.

In exemplary embodiments of the present inventive concept, the first input terminal of the comparator may be a positive input terminal, the second input terminal of the comparator may be a negative input terminal, and the transistor may be a PMOS transistor.

In exemplary embodiments of the present inventive concept, the comparison result signal may have a high voltage level when the first voltage is higher than the reference voltage, and the transistor may be turned off when the comparison result signal has the high voltage level.

In exemplary embodiments of the present inventive concept, the comparison result signal may have a low voltage level when the first voltage is lower than the reference voltage, and the transistor may be turned on when the comparison result signal has the low voltage level.

According to exemplary embodiments of the present inventive concept, a display device may include a display panel including a plurality of pixel circuits, a scan driver configured to provide a scan signal to the pixel circuits, a data driver configured to provide a data signal to the pixel circuits, a timing controller configured to control the scan driver and the data driver and to operate based on a reset signal, and a timing controller resetting circuit configured to receive a source voltage output from a power source and to generate the reset signal based on the source voltage. The timing controller may operate after the reset signal switches from a low voltage level to a high voltage level as the power source is turned on. The timing controller may not operate after the reset signal switches from the high voltage level to the low voltage level as the power source is turned off. In addition, the timing controller resetting circuit may drop the reset signal to the low voltage level when the source voltage becomes lower than a reference voltage as the power source is turned off. Further, the timing controller resetting circuit may maintain the reset signal to have the low voltage level before the source voltage becomes higher than the reference voltage as the power source is turned on.

In exemplary embodiments of the present inventive concept, the timing controller may generate, using the source voltage, a plurality of control signals for controlling the scan driver and the data driver.

In exemplary embodiments of the present inventive concept, the timing controller resetting circuit may include a resistor connected to an output node from which the reset signal is output and the power source, a capacitor connected to the output node and a ground source which supplies a ground voltage, a reference voltage source configured to generate the reference voltage, wherein the reference voltage is lower than the source voltage and higher than the ground voltage, a comparator including a first input terminal which receives the source voltage, a second input terminal which receives the reference voltage, and an output terminal which outputs a comparison result signal generated by comparing the source voltage with the reference voltage, and a transistor including a first terminal which is connected to the output node, a second terminal which receives the ground voltage, and a gate terminal which receives the comparison result signal.

In exemplary embodiments of the present inventive concept, the timing controller resetting circuit may include a resistor connected to an output node from which the reset signal is output and the power source, a capacitor connected to the output node and a ground source which supplies a ground voltage, a comparator including a first input terminal which receives the source voltage, a second input terminal which receives the reference voltage, wherein the reference voltage is lower than the source voltage and higher than the ground voltage, and an output terminal which outputs a comparison result signal generated by comparing the source voltage with the reference voltage, and a transistor including a first terminal which is connected to the output node, a second terminal which receives the ground voltage, and a gate terminal which receives the comparison result signal.

BRIEF DESCRIPTION OF THE DRAWINGS

The above and other features of the present inventive concept will become more apparent by describing in detail exemplary embodiments thereof in conjunction with the accompanying drawings.

DETAILED DESCRIPTION OF THE EMBODIMENTS

Hereinafter, exemplary embodiments of the present inventive concept will be explained in detail with reference to the accompanying drawings.

Figure 1:
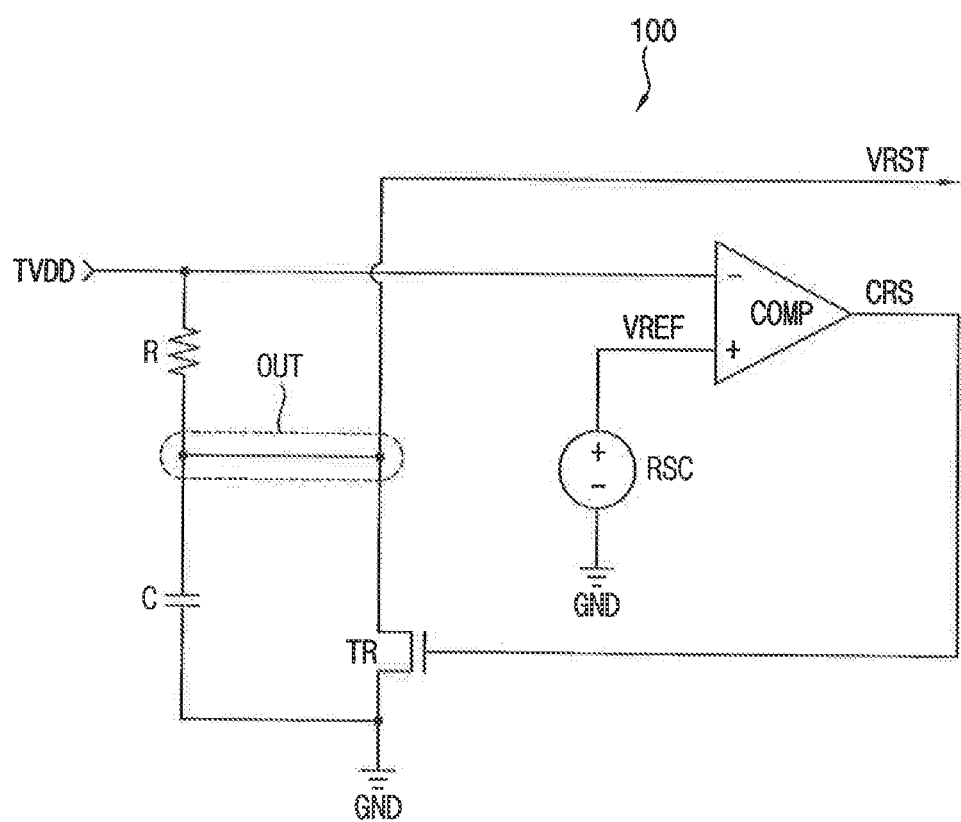
FIG. 1 is a circuit diagram illustrating a timing controller resetting circuit according to exemplary embodiments of the present inventive concept.
Figure 2:
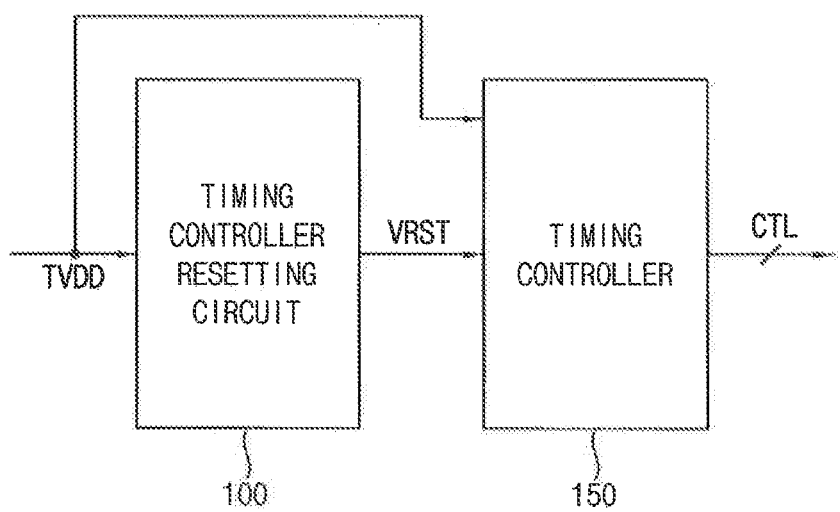
FIG. 2 is a block diagram illustrating an example in which the timing controller resetting circuit of FIG. 1 provides a reset signal to a timing controller.
Figure 3:
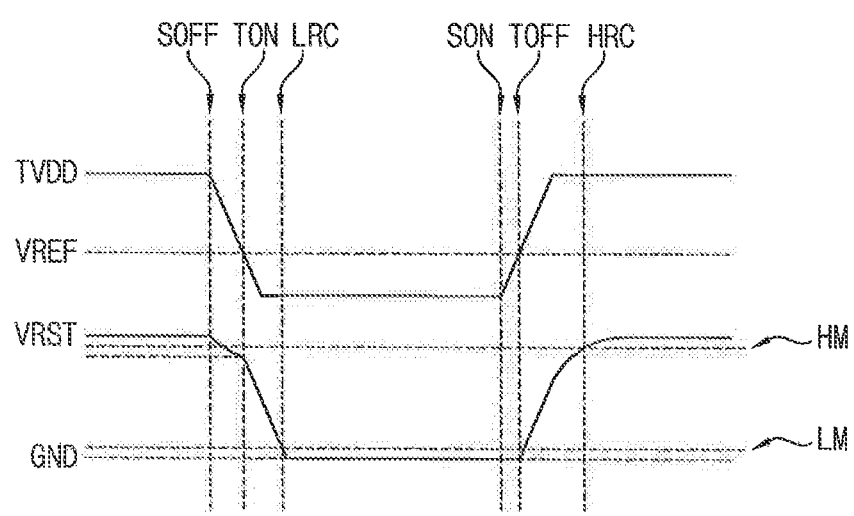
FIG. 3 is a waveform diagram illustrating a reset signal that is output from the timing controller resetting circuit of FIG. 1.
Figure 4:
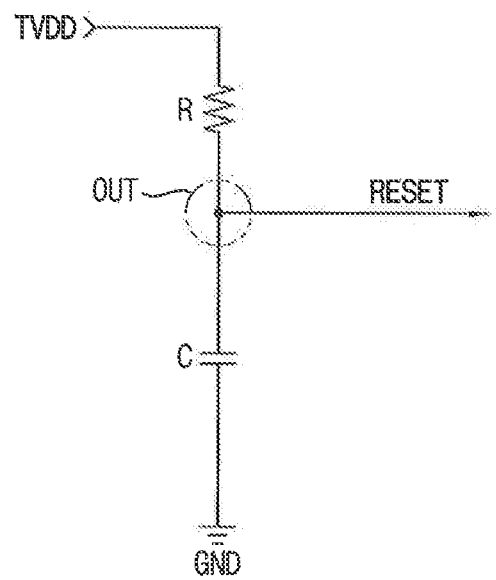
FIG. 4 is a circuit diagram illustrating a conventional timing controller resetting circuit.
Figure 5:
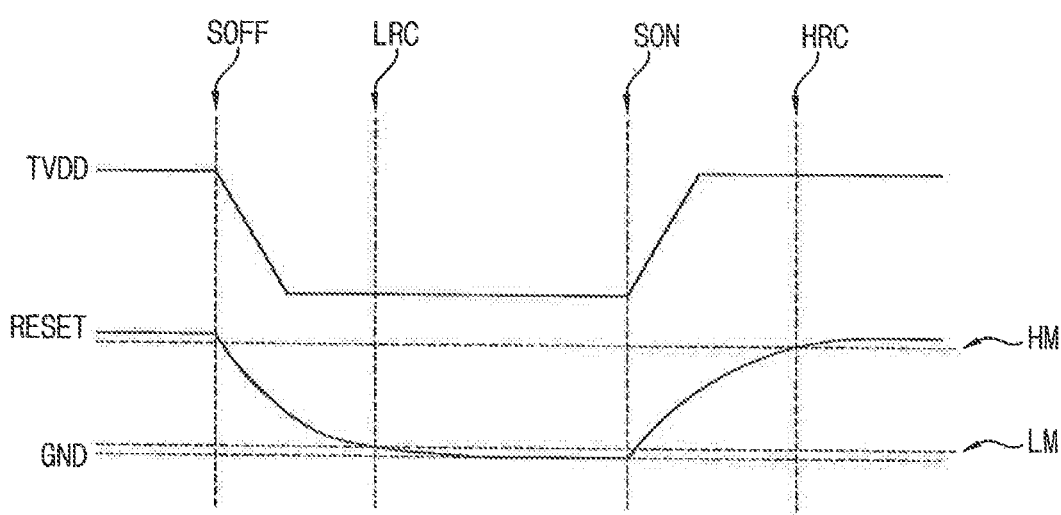
FIG. 5 is a waveform diagram illustrating a reset signal that is output from the conventional timing controller resetting circuit.
Figure 6:
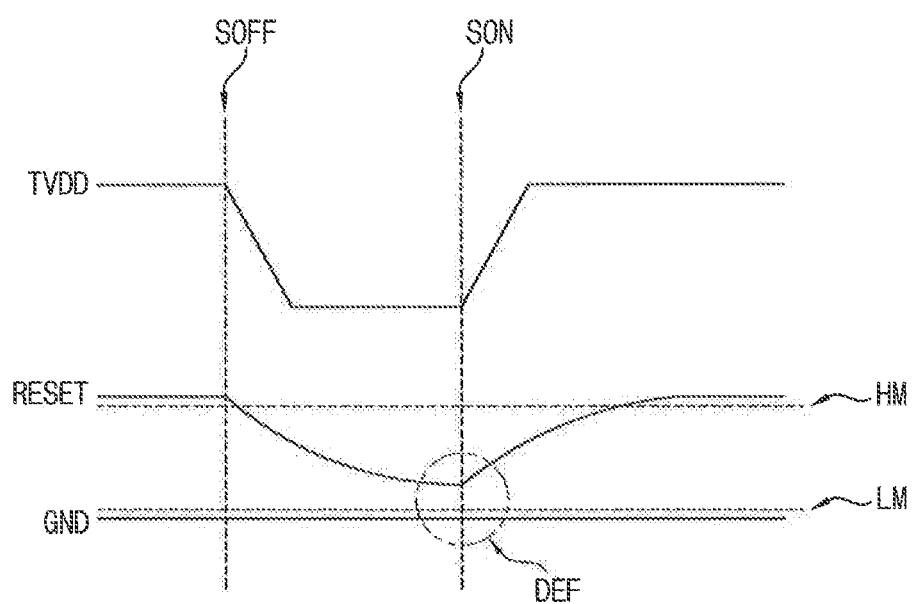
FIG. 6 is a waveform diagram illustrating a reset signal that is output from the conventional timing controller resetting circuit when a power source is repeatedly turned on and off in a short time.

FIG. 1 is a circuit diagram illustrating a timing controller resetting circuit according to exemplary embodiments of the present inventive concept, FIG. 2 is a block diagram illustrating an example in which the timing controller resetting circuit of FIG. 1 provides a reset signal to a timing controller, FIG. 3 is a waveform diagram illustrating a reset signal that is output from the timing controller resetting circuit of FIG. 1, FIG. 4 is a circuit diagram illustrating a conventional timing controller resetting circuit, FIG. 5 is a waveform diagram illustrating a reset signal that is output from the conventional timing controller resetting circuit, and FIG. 6 is a waveform diagram illustrating a reset signal that is output from the conventional timing controller resetting circuit when a power source is repeatedly turned on and off in a short amount of time.

Referring to FIGS. 1 to 6, the timing controller resetting circuit 100 may include a resistor R, a capacitor C, a reference voltage source RSC, a comparator COMP, and a transistor TR. Here, the transistor TR may be an n-channel metal oxide semiconductor (NMOS) transistor.

The resistor R may be connected between an output node OUT at which a reset signal VRST is output and a first voltage source that supplies a first voltage TVDD. In an exemplary embodiment of the present inventive concept, the first voltage source may be a power source, and the first voltage TVDD may be a source voltage supplied by the power source. As illustrated in FIG. 2, the timing controller resetting circuit 100 may generate the reset signal VRST based on the source voltage (e.g., the first voltage TVDD) output from the power source to provide the reset signal VRST to the timing controller 150. The timing controller 150 may decide whether to operate based on the reset signal VRST. For example, the timing controller 150 may operate after the reset signal VRST switches from a low voltage level to a high voltage level as the power source is turned on (e.g., indicated by SON). The timing controller 150 may not operate after the reset signal VRST switches from the high voltage level to the low voltage level as the power source is turned off (e.g., indicated by SOFF). The timing controller 150 may generate various control signals CTL based on the source voltage (e.g., the first voltage TVDD) output from the power source. The capacitor C may be connected between the output node OUT at which the reset signal VRST is output and a second voltage source that supplies a second voltage GND that is lower than the first voltage TVDD. In an exemplary embodiment of the present inventive concept, the second voltage source may be a ground source, and the second voltage GND may be a ground voltage supplied by the ground source. In brief, the timing controller resetting circuit 100 may include the resistor R and the capacitor C connected in series between the source voltage (e.g., the first voltage TVDD) and the second voltage GND. In other words, the timing controller resetting circuit 100 may include an RC circuit. Thus, the timing controller resetting circuit 100 may generate the reset signal VRST by an RC delay of the source voltage (e.g., the first voltage TVDD) output from the power source and may output the reset signal VRST from the output node OUT located between the resistor R and the capacitor C.

As illustrated in FIG. 4, a conventional timing controller resetting circuit may include a resistor R and a capacitor C connected in series between the first voltage TVDD and the second voltage GND. Thus, the conventional timing controller resetting circuit may generate a reset signal RESET by an RC delay of the first voltage TVDD output from the power source and may output the reset signal RESET from the output node OUT located between the resistor R and the capacitor C. For example, as illustrated in FIG. 5, the conventional timing controller resetting circuit may output the reset signal RESET which has a voltage level gradually decreasing to a given low voltage level as the power source switches from a turn-on state to a turn-off state (e.g., indicated by SOFF) and may output the reset signal RESET which has a voltage level gradually increasing to a given high voltage level as the power source switches from the turn-off state to the turn-on state (e.g., indicated by SON). Thus, the timing controller may determine that the reset signal RESET has the low voltage level (e.g., indicated by LRC) when the voltage level of the reset signal RESET reaches a predetermined low-determination voltage level LM and may determine that the reset signal RESET has the high voltage level (e.g., indicated by HRC) when the voltage level of the reset signal RESET reaches a predetermined high-determination voltage level HM. However, as illustrated in FIG. 6, in the conventional timing controller resetting circuit, when the power source switches to the turn-on state (e.g., indicated by SON) in a short period of time after switching to the turn-off state (e.g., indicated by SOFF), the reset signal RESET may begin to switch to the high voltage level (e.g., indicated by DEF) before reaching a low voltage level sufficient to be recognized as the low voltage level. In other words, before the voltage level of the reset signal RESET reaches the predetermined low-determination voltage level LM, the voltage level of the reset signal RESET may begin to transition high. Additionally, in the conventional timing controller resetting circuit, when the power source switches to the turn-off state (e.g., indicated by SOFF) in a short period of time after switching to the turn-on state (e.g., indicated by SON), the reset signal RESET may begin to switch to the low voltage level before reaching a high voltage level sufficient to be recognized as the high voltage level. In other words, before the voltage level of the reset signal RESET reaches the predetermined high-determination voltage level HM, the voltage level of the reset signal RESET may begin to transition low. As a result, when the power source is repeatedly turned on and off (e.g., indicated by SON and SOFF) in short periods of time, the conventional timing controller resetting circuit may generate the reset signal RESET which causes a reset signal recognition failure of the timing controller.

In accordance with an exemplary embodiment of the present inventive concept, the timing controller resetting circuit 100 may further include the reference voltage source RSC, the comparator COMP, and the transistor TR in addition to the resistor R and the capacitor C. For example, the reference voltage source RSC may generate a reference voltage VREF that is lower than the first voltage TVDD and higher than the second voltage GND. The comparator COMP may include a first input terminal (e.g., indicated by −) which receives the first voltage TVDD, a second input terminal (e.g., indicated by +) which receives the reference voltage VREF from the reference voltage source RSC, and an output terminal which outputs a comparison result signal CRS generated by comparing the first voltage TVDD with the reference voltage VREF. The transistor TR may include a first terminal which is connected to the output node OUT from which the reset signal VRST is output, a second terminal which receives the second voltage GND, and a gate terminal which receives the comparison result signal CRS from the comparator COMP. As illustrated in FIG. 1, the first input terminal (e.g., indicated by −) of the comparator COMP may be a negative input terminal, the second input terminal (e.g., indicated by +) of the comparator COMP may be a positive input terminal, and the transistor TR may be an NMOS transistor. Thus, when the first voltage TVDD applied to the negative input terminal of the comparator COMP is higher than the reference voltage VREF applied to the positive input terminal of the comparator COMP, the comparison result signal CRS output from the output terminal of the comparator COMP may have the low voltage level. As a result, the transistor TR may be turned off (e.g., indicated by TOFF) in response to the comparison result signal CRS having the low voltage level. When the first voltage TVDD applied to the negative input terminal of the comparator COMP is lower than the reference voltage VREF applied to the positive input terminal of the comparator COMP, the comparison result signal CRS output from the output terminal of the comparator COMP may have the high voltage level. As a result, the transistor TR may be turned on (e.g., indicated by TON) in response to the comparison result signal CRS having the high voltage level.

As illustrated in FIG. 3, the timing controller resetting circuit 100 may output the reset signal VRST which has a voltage level gradually decreasing to a given low voltage level as the power source switches from the turn-on state to the turn-off state (e.g., indicated by SOFF) and may output the reset signal VRST which has a voltage level gradually increasing to a given high voltage level as the power source switches from the turn-off state to the turn-on state (e.g., indicated by SON). Here, the timing controller 150 may determine that the reset signal VRST has the low voltage level (e.g., indicated by LRC) when the voltage level of the reset signal VRST reaches the predetermined low-determination voltage level LM and may determine that the reset signal VRST has the high voltage level (e.g., indicated by HRC) when the voltage level of the reset signal VRST reaches the predetermined high-determination voltage level HM. In exemplary embodiments of the present inventive concept, the timing controller resetting circuit 100 may sharply drop the reset signal VRST to the low voltage level (e.g., pull-down the reset signal VRST) when the first voltage TVDD becomes lower than the reference voltage VREF as the power source is turned off (e.g., indicated by SOFF). In addition, the timing controller resetting circuit 100 may maintain the reset signal VRST at the low voltage level before the first voltage TVDD goes higher than the reference voltage VREF as the power source is turned on (e.g., indicated by SON).

For example, as illustrated in FIGS. 1 and 3, when the first voltage TVDD applied to the negative input terminal of the comparator COMP becomes lower than the reference voltage VREF applied to the positive input terminal of the comparator COMP as the power source is turned off (e.g., indicated by SOFF), the comparison result signal CRS output from the output terminal of the comparator COMP may have the high voltage level, and thus, the transistor TR may be turned on (e.g., indicated by TON). Thus, the output node OUT may be electrically connected to the ground source which supplies the second voltage GND. As a result, the reset signal VRST output from the output node OUT may be sharply dropped to the low voltage level. In other words, the reset signal VRST may quickly decrease. In addition, before the first voltage TVDD applied to the negative input terminal of the comparator COMP becomes higher than the reference voltage VREF applied to the positive input terminal of the comparator COMP as the power source is turned on (e.g., indicated by SON), the comparison result signal CRS output from the output terminal of the comparator COMP may still have the high voltage level, and thus, the transistor TR may be turned on. Thus, the output node OUT may be electrically connected to the ground source which supplies the second voltage GND. As a result, the reset signal VRST output at the output node OUT may be maintained with the low voltage level. Subsequently, when the first voltage TVDD applied to the negative input terminal of the comparator COMP becomes higher than the reference voltage VREF applied to the positive input terminal of the comparator COMP, the comparison result signal CRS output from the output terminal of the comparator COMP may have the low voltage level, and thus, the transistor TR may be turned off (e.g., indicated by TOFF). Thus, the output node OUT may be electrically separated from the ground source which supplies the second voltage GND. As a result, the reset signal VRST output from the output node OUT may be sharply increased along with the first voltage TVDD. In other words, the reset signal VRST may quickly increase.

As described above, the timing controller resetting circuit 100 may generate the reset signal VRST based on the source voltage (e.g., the first voltage TVDD) output from the power source and may provide the reset signal VRST to the timing controller 150. Here, the timing controller resetting circuit 100 may sharply drop the reset signal VRST to the low voltage level when the source voltage (e.g., the first voltage TVDD) output from the power source becomes lower than the reference voltage VREF as the power source is turned off (e.g., indicated by SOFF) and may maintain the reset signal VRST to have the low voltage level before the source voltage (e.g., the first voltage TVDD) output from the power source becomes higher than the reference voltage VREF as the power source is turned on (e.g., indicated by SON). Thus, the timing controller resetting circuit 100 may effectively prevent the reset signal recognition failure of the timing controller 150, which can occur when the power source is repeatedly turned on and off in a short amount of time. As a result, a display device including the timing controller resetting circuit 100 may effectively prevent the timing controller 150 from malfunctioning due to the reset signal recognition failure of the timing controller 150. Although it is illustrated in FIG. 2 that the timing controller resetting circuit 100 is separate from the timing controller 150, in some exemplary embodiments of the present inventive concept, the timing controller resetting circuit 100 may be implemented in the timing controller 150.

Figure 7:
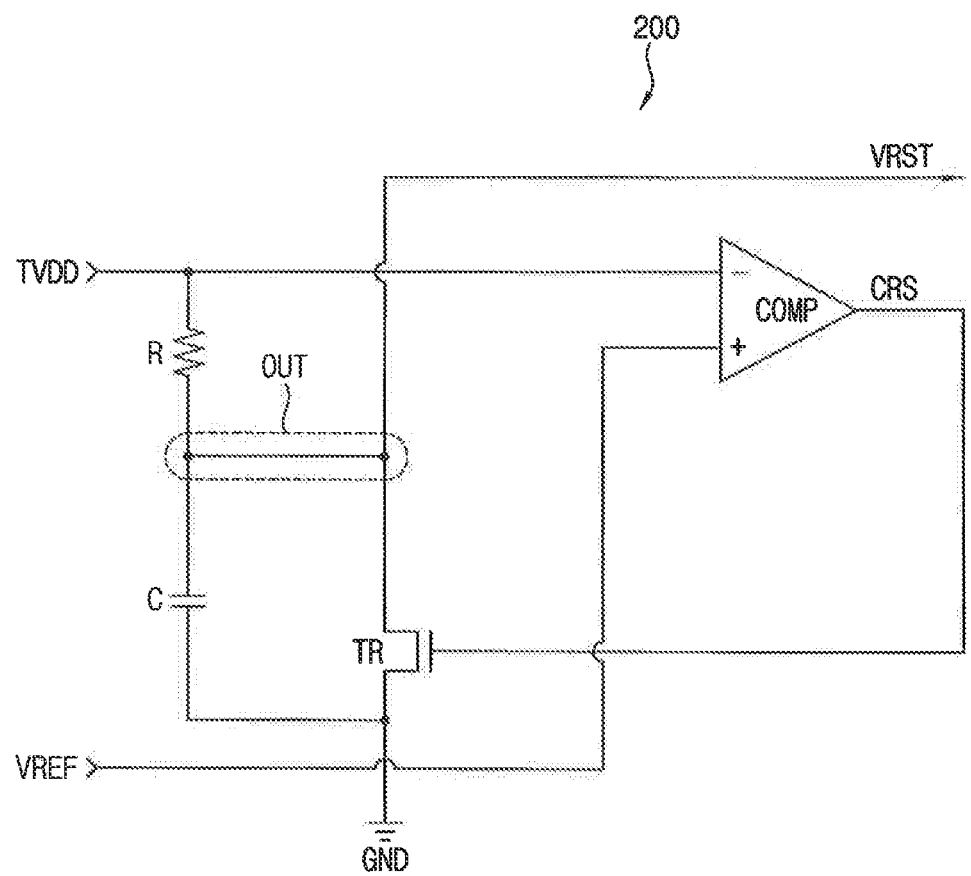
FIG. 7 is a circuit diagram illustrating a timing controller resetting circuit according to exemplary embodiments of the present inventive concept.

FIG. 7 is a circuit diagram illustrating a timing controller resetting circuit according to exemplary embodiments of the present inventive concept.

Referring to FIG. 7, the timing controller resetting circuit 200 may include a resistor R, a capacitor C, a comparator COMP, and a transistor TR. Here, the transistor TR may be an NMOS transistor.

The resistor R may be connected between an output node OUT at which a reset signal VRST is output and a first voltage source which supplies a first voltage TVDD. In an exemplary embodiment of the present inventive concept, the first voltage source may be a power source, and the first voltage TVDD may be a source voltage supplied by the power source. The capacitor C may be connected between the output node OUT at which the reset signal VRST is output and a second voltage source which supplies a second voltage GND that is lower than the first voltage TVDD. In an exemplary embodiment of the present inventive concept, the second voltage source may be a ground source, and the second voltage GND may be a ground voltage supplied by the ground source. In brief, the timing controller resetting circuit 200 may include the resistor R and the capacitor C connected in series between the first voltage TVDD and the second voltage GND. Thus, the timing controller resetting circuit 200 may generate the reset signal VRST by an RC delay of the first voltage TVDD output from the power source and may output the reset signal VRST from the output node OUT located between the resistor R and the capacitor C. The comparator COMP may include a first input terminal (e.g., indicated by −) which receives the first voltage TVDD, a second input terminal (e.g., indicated by +) which receives the reference voltage VREF that is lower than the first voltage TVDD and higher than the second voltage GND from an external source. In addition, the comparator COMP may include an output terminal which outputs a comparison result signal CRS generated by comparing the first voltage TVDD with the reference voltage VREF. In other words, unlike the timing controller resetting circuit 100 of FIG. 1, the timing controller resetting circuit 200 may not include an internal source that generates the reference voltage VREF. The transistor TR may include a first terminal which is connected to the output node OUT from which the reset signal VRST is output, a second terminal which receives the second voltage GND, and a gate terminal which receives the comparison result signal CRS from the comparator COMP. As illustrated in FIG. 7, the first input terminal (e.g., indicated by −) of the comparator COMP may be a negative input terminal, the second input terminal (e.g., indicated by +) of the comparator COMP may be a positive input terminal, and the transistor TR may be an NMOS transistor. Thus, when the first voltage TVDD applied to the negative input terminal of the comparator COMP is higher than the reference voltage VREF applied to the positive input terminal of the comparator COMP, the comparison result signal CRS output from the output terminal of the comparator COMP may have a low voltage level. As a result, the transistor TR may be turned off in response to the comparison result signal CRS having the low voltage level. When the first voltage TVDD applied to the negative input terminal of the comparator COMP is lower than the reference voltage VREF applied to the positive input terminal of the comparator COMP, the comparison result signal CRS output from the output terminal of the comparator COMP may have a high voltage level. As a result, the transistor TR may be turned on in response to the comparison result signal CRS having the high voltage level.

As described above, when the first voltage TVDD applied to the negative input terminal of the comparator COMP becomes lower than the reference voltage VREF applied to the positive input terminal of the comparator COMP as the power source is turned off, the comparison result signal CRS output from the output terminal of the comparator COMP may have the high voltage level, and thus, the transistor TR may be turned on. Thus, the output node OUT may be electrically connected to the ground source which supplies the second voltage GND. As a result, the reset signal VRST output from the output node OUT may be sharply dropped to the low voltage level. In addition, before the first voltage TVDD applied to the negative input terminal of the comparator COMP becomes higher than the reference voltage VREF applied to the positive input terminal of the comparator COMP as the power source is turned on, the comparison result signal CRS output from the output terminal of the comparator COMP may still have the high voltage level, and thus, the transistor TR may be turned on. Thus, the output node OUT may be electrically connected to the ground source which supplies the second voltage GND. As a result, the reset signal VRST output from the output node OUT may be maintained with the low voltage level. Subsequently, when the first voltage TVDD applied to the negative input terminal of the comparator COMP becomes higher than the reference voltage VREF applied to the positive input terminal of the comparator COMP, the comparison result signal CRS output from the output terminal of the comparator COMP may have the low voltage level, and thus, the transistor TR may be turned off. Thus, the output node OUT may be electrically separated from the ground source which supplies the second voltage GND. As a result, the reset signal VRST output from the output node OUT may be sharply increased along with the first voltage TVDD. As described above, the timing controller resetting circuit 200 may generate the reset signal VRST based on the source voltage (e.g., the first voltage TVDD) output from the power source and may provide the reset signal VRST to the timing controller 150. Here, the timing controller resetting circuit 200 may sharply drop the reset signal VRST to the low voltage level when the source voltage (e.g., the first voltage TVDD) output from the power source becomes lower than the reference voltage VREF as the power source is turned off and may maintain the reset signal VRST to have the low voltage level before the source voltage (e.g., the first voltage TVDD) output from the power source becomes higher than the reference voltage VREF as the power source is turned on. Thus, the timing controller resetting circuit 200 may effectively prevent a reset signal recognition failure of the timing controller 150, which can occur when the power source is repeatedly turned on and off in a short amount of time. As a result, a display device including the timing controller resetting circuit 200 may effectively prevent the timing controller from malfunctioning due to the reset signal recognition failure of the timing controller 150.

Figure 8:
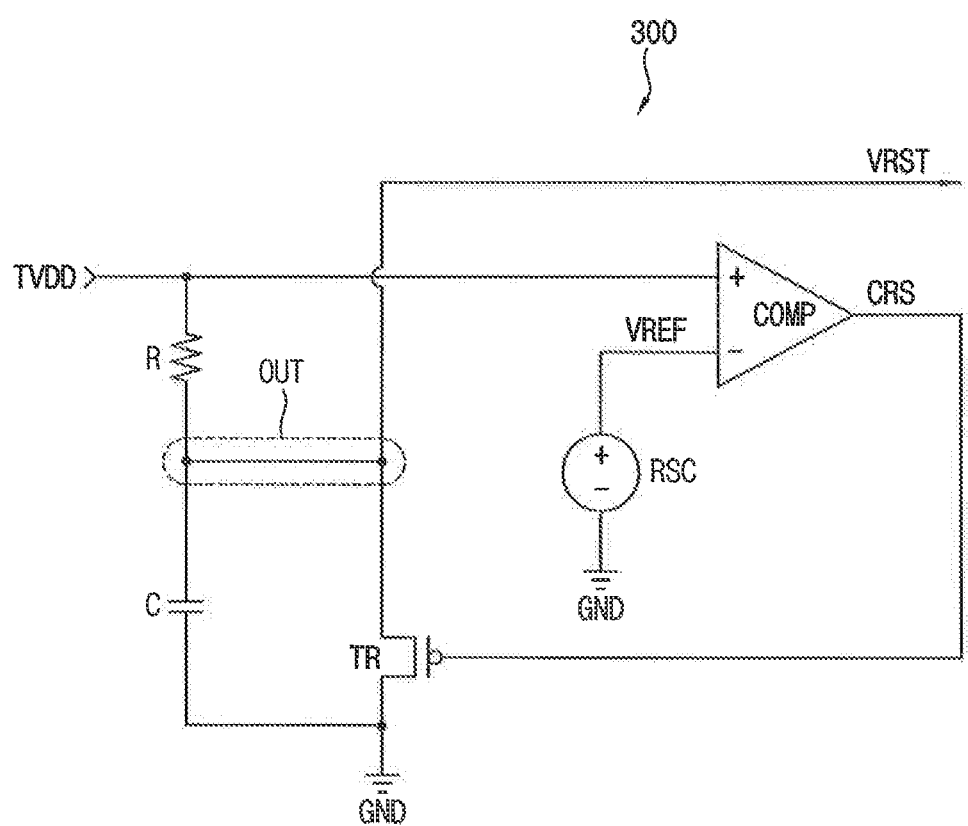
FIG. 8 is a circuit diagram illustrating a timing controller resetting circuit according to exemplary embodiments of the present inventive concept.

FIG. 8 is a circuit diagram illustrating a timing controller resetting circuit according to exemplary embodiments of the present inventive concept.

Referring to FIG. 8, the timing controller resetting circuit 300 may include a resistor R, a capacitor C, a reference voltage source RSC, a comparator COMP, and a transistor TR. Except that a first input terminal (e.g., indicated by +) of the comparator COMP is a positive input terminal, a second input terminal (e.g., indicated by −) of the comparator COMP is a negative input terminal, and the transistor TR is a p-channel metal oxide semiconductor (PMOS) transistor, the timing controller resetting circuit 300 is substantially the same as the timing controller resetting circuit 100 of FIG. 1. Thus, the timing controller resetting circuit 300 will be described focusing on the comparator COMP and the transistor TR.

For example, the comparator COMP may include a first input terminal (e.g., indicated by +) which receives the first voltage TVDD, a second input terminal (e.g., indicated by −) which receives the reference voltage VREF from the reference voltage source RSC, and an output terminal which outputs a comparison result signal CRS generated by comparing the first voltage TVDD with the reference voltage VREF. The transistor TR may include a first terminal which is connected to an output node OUT from which a reset signal VRST is output, a second terminal which receives a second voltage GND, and a gate terminal which receives the comparison result signal CRS from the comparator COMP. As illustrated in FIG. 8, the first input terminal (e.g., indicated by +) of the comparator COMP may be a positive input terminal, the second input terminal (e.g., indicated by −) of the comparator COMP may be a negative input terminal, and the transistor TR may be a PMOS transistor. Thus, when the first voltage TVDD applied to the positive input terminal of the comparator COMP is higher than the reference voltage VREF applied to the negative input terminal of the comparator COMP, the comparison result signal CRS output from the output terminal of the comparator COMP may have a high voltage level. As a result, the transistor TR may be turned off in response to the comparison result signal CRS having the high voltage level. When the first voltage TVDD applied to the positive input terminal of the comparator COMP is lower than the reference voltage VREF applied to the negative input terminal of the comparator COMP, the comparison result signal CRS output from the output terminal of the comparator COMP may have a low voltage level. As a result, the transistor TR may be turned on in response to the comparison result signal CRS having the low voltage level.

Therefore, when the first voltage TVDD applied to the positive input terminal of the comparator COMP becomes lower than the reference voltage VREF applied to the negative input terminal of the comparator COMP as the power source is turned off, the comparison result signal CRS output from the output terminal of the comparator COMP may have the low voltage level, and thus, the transistor TR may be turned on. Thus, the output node OUT may be electrically connected to the ground source which supplies the second voltage GND. As a result, the reset signal VRST output from the output node OUT may be sharply dropped to the low voltage level. In addition, before the first voltage TVDD applied to the positive input terminal of the comparator COMP becomes higher than the reference voltage VREF applied to the negative input terminal of the comparator COMP as the power source is turned on, the comparison result signal CRS output from the output terminal of the comparator COMP may still have the low voltage level, and thus, the transistor TR may be turned on. Thus, the output node OUT may be electrically connected to the ground source which supplies the second voltage GND. As a result, the reset signal VRST output from the output node OUT may be maintained to have the low voltage level. Subsequently, when the first voltage TVDD applied to the positive input terminal of the comparator COMP becomes higher than the reference voltage VREF applied to the negative input terminal of the comparator COMP, the comparison result signal CRS output from the output terminal of the comparator COMP may have the high voltage level, and thus, the transistor TR may be turned off. Thus, the output node OUT may be electrically separated from the ground source which supplies the second voltage GND. As a result, the reset signal VRST output from the output node OUT may be sharply increased along with the first voltage TV DI).

As described above, the timing controller resetting circuit 300 may generate the reset signal VRST based on the source voltage (e.g., the first voltage TVDD) output from the power source and may provide the reset signal VRST to the timing controller 150. Here, the timing controller resetting circuit 300 may sharply drop the reset signal VRST to the low voltage level when the source voltage (e.g., the first voltage TVDD) output from the power source becomes lower than the reference voltage VREF as the power source is turned off and may maintain the reset signal VRST to have the low voltage level before the source voltage (e.g., the first voltage TVDD) output from the power source becomes higher than the reference voltage VREF as the power source is turned on. Thus, the timing controller resetting circuit 300 may effectively prevent a reset signal recognition failure of the timing controller, which can occur when the power source is repeatedly turned on and off in a short amount of time. As a result, a display device including the timing controller resetting circuit 300 may effectively prevent the timing controller from malfunctioning due to the reset signal recognition failure of the timing controller 150.

Figure 9:
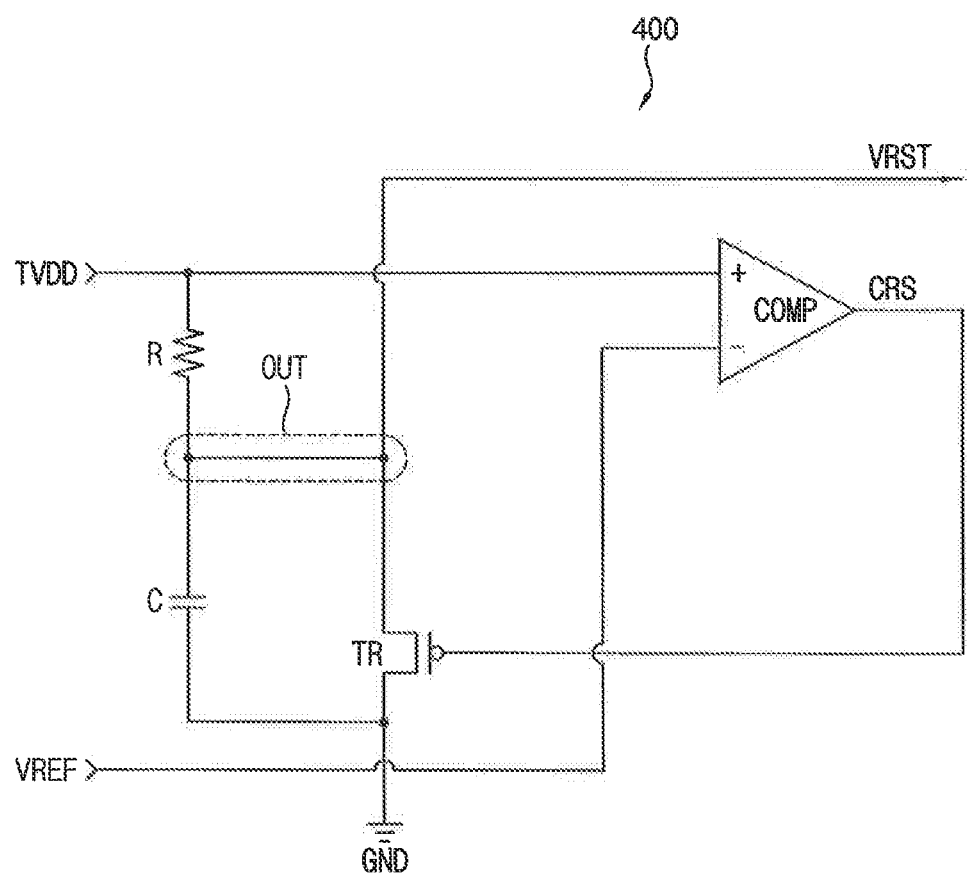
FIG. 9 is a circuit diagram illustrating a timing controller resetting circuit according to exemplary embodiments of the present inventive concept.

FIG. 9 is a circuit diagram illustrating a timing controller resetting circuit according to exemplary embodiments of the present inventive concept.

Referring to FIG. 9, the timing controller resetting circuit 400 may include a resistor R, a capacitor C, a comparator COMP, and a transistor TR. Except that a first input terminal (e.g., indicated by +) of the comparator COMP is a positive input terminal, a second input terminal (e.g., indicated by −) of the comparator COMP is a negative input terminal, and the transistor TR is a PMOS transistor, the timing controller resetting circuit 400 is substantially the same as the timing controller resetting circuit 200 of FIG. 7. Thus, the timing controller resetting circuit 400 will be described focusing on the comparator COMP and the transistor TR.

For example, the comparator COMP may include a first input terminal (e.g., indicated by +) which receives the first voltage TVDD, a second input terminal (e.g., indicated by −) which receives the reference voltage VREF that is lower than the first voltage TVDD and higher than a second voltage GND from an external source, and an output terminal which outputs a comparison result signal CRS generated by comparing the first voltage TVDD with the reference voltage VREF. The transistor TR may include a first terminal which is connected to an output node OUT from which a reset signal VRST is output, a second terminal which receives the second voltage GND, and a gate terminal which receives the comparison result signal CRS from the comparator COMP. As illustrated in FIG. 9, the first input terminal (e.g., indicated by +) of the comparator COMP may be a positive input terminal, the second input terminal (e.g., indicated by −) of the comparator COMP may be a negative input terminal, and the transistor TR may be a PMOS transistor. Thus, when the first voltage TVDD applied to the positive input terminal of the comparator COMP is higher than the reference voltage VREF applied to the negative input terminal of the comparator COMP, the comparison result signal CRS output from the output terminal of the comparator COMP may have a high voltage level. As a result, the transistor TR may be turned off in response to the comparison result signal CRS having the high voltage level. When the first voltage TVDD applied to the positive input terminal of the comparator COMP is lower than the reference voltage VREF applied to the negative input terminal of the comparator COMP, the comparison result signal CRS output from the output terminal of the comparator COMP may have a low voltage level. As a result, the transistor TR may be turned on in response to the comparison result signal CRS having the low voltage level.

Therefore, when the first voltage TVDD applied to the positive input terminal of the comparator COMP becomes lower than the reference voltage VREF applied to the negative input terminal of the comparator COMP as the power source is turned off, the comparison result signal CRS output from the output terminal of the comparator COMP may have the low voltage level, and thus, the transistor TR may be turned on. Thus, the output node OUT may be electrically connected to the ground source which supplies the second voltage GND. As a result, the reset signal VRST output from the output node OUT may be sharply dropped to the low voltage level. In addition, before the first voltage TVDD applied to the positive input terminal of the comparator COMP becomes higher than the reference voltage VREF applied to the negative input terminal of the comparator COMP as the power source is turned on, the comparison result signal CRS output from the output terminal of the comparator COMP may still have the low voltage level, and thus, the transistor TR may be turned on. Thus, the output node OUT may be electrically connected to the ground source which supplies the second voltage GND. As a result, the reset signal VRST output from the output node OUT may maintain the low voltage level. Subsequently, when the first voltage TVDD applied to the positive input terminal of the comparator COMP becomes higher than the reference voltage VREF applied to the negative input terminal of the comparator COMP, the comparison result signal CRS output from the output terminal of the comparator COMP may have the high voltage level, and thus, the transistor TR may be turned off. Thus, the output node OUT may be electrically separated from the ground source which supplies the second voltage GND. As a result, the reset signal VRST output from the output node OUT may be sharply increased along with the first voltage TVDD.

As described above, the timing controller resetting circuit 400 may generate the reset signal VRST based on the source voltage (e.g., the first voltage TVDD) output from the power source and may provide the reset signal VRST to the timing controller 150. Here, the timing controller resetting circuit 400 may sharply drop the reset signal VRST to the low voltage level when the source voltage (e.g., the first voltage TVDD) output from the power source becomes lower than the reference voltage VREF as the power source is turned off and may maintain the reset signal VRST to have the low voltage level before the source voltage (e.g., the first voltage TVDD) output from the power source becomes higher than the reference voltage VREF as the power source is turned on. Thus, the timing controller resetting circuit 400 may effectively prevent a reset signal recognition failure of the timing controller, which can occur when the power source is repeatedly turned on and off in a short amount of time. As a result, a display device including the timing controller resetting circuit 400 may effectively prevent the timing controller 150 from malfunctioning due to the reset signal recognition failure of the timing controller 150.

Figure 10:
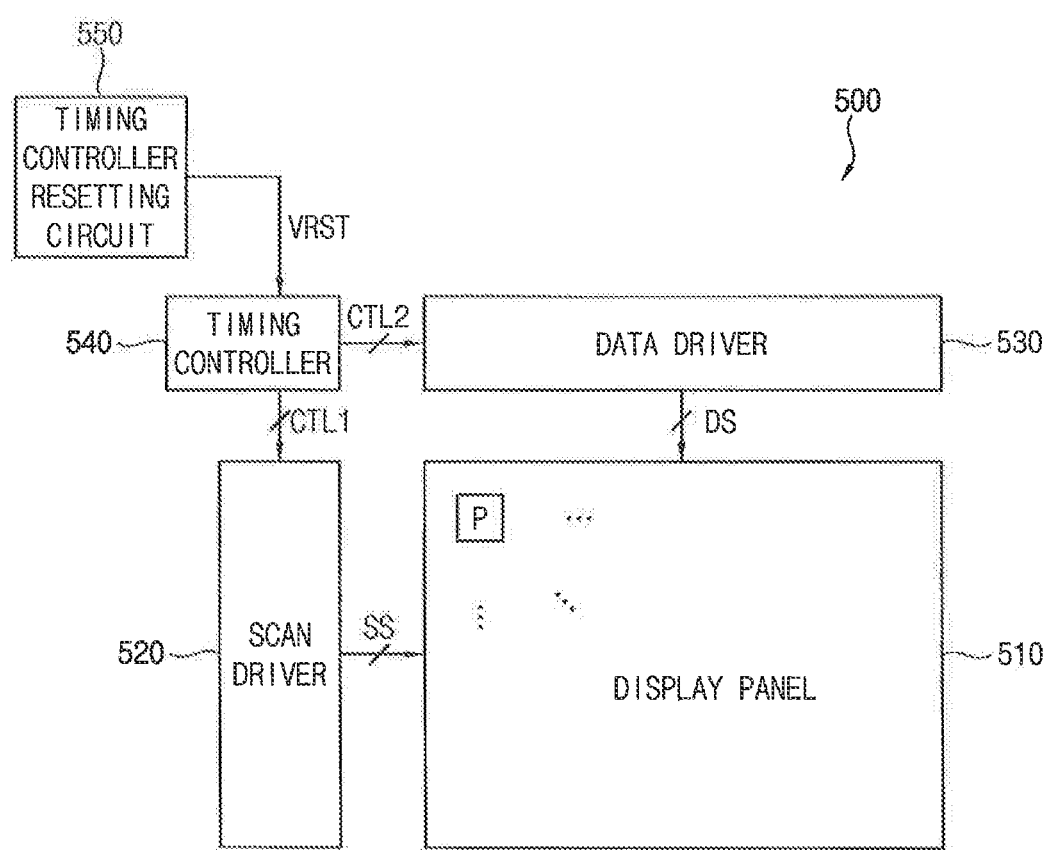
FIG. 10 is a block diagram illustrating a display device according to exemplary embodiments of the present inventive concept.

FIG. 10 is a block diagram illustrating a display device according to exemplary embodiments of the present inventive concept.

Referring to FIG. 10, the display device 500 may include a display panel 510, a scan driver 520, a data driver 530, a timing controller 540, and a timing controller resetting circuit 550. Here, the display device 500 may be an organic light emitting display (OLED) device or a liquid crystal display (LCD) device. However, the display device 500 is not limited thereto.

The display panel 510 may include a plurality of pixel circuits P. The display panel 510 may be connected to the scan driver 520 via scan-lines and may be connected to the data driver 530 via data-lines. Here, the pixel circuits P may be arranged in various forms in the display panel 510. For example, the pixel circuits P may by arranged in a matrix. The scan driver 520 may provide a scan signal SS to the pixel circuits P of the display panel 510 via the scan-lines. The data driver 530 may convert image data received from the timing controller 540 into a data voltage (e.g., a data signal DS) and may provide the data signal DS to the pixel circuits P of the display panel 510. The timing controller 540 may control the scan driver 520 and the data driver 530. In this case, the timing controller 540 may generate, using the source voltage output from the power source, a plurality of control signals CTL1 and CTL2 for controlling the scan driver 520 and the data driver 530. In some exemplary embodiments of the present inventive concept, the timing controller 540 may receive the image data from an external component, may perform a predetermined processing (e.g., data compensation processing, etc) on the image data, and then, may provide the processed image data to the data driver 530. In exemplary embodiments of the present inventive concept, the timing controller 540 may determine whether to operate based on a reset signal VRST received from the timing controller resetting circuit 550. For example, the timing controller 540 may operate after the reset signal VRST switches from a low voltage level to a high voltage level as the power source is turned on. The timing controller 540 may not operate after the reset signal VRST switches from the high voltage level to the low voltage level as the power source is turned off. In some exemplary embodiments of the present inventive concept, the display device 500 may further include an emission control driver. In this case, the emission control driver may be connected to the display panel 510 via emission control-lines. The emission control driver may provide an emission control signal to the pixel circuits P of the display panel 510 via the emission control-lines.

The timing controller resetting circuit 550 may drop the reset signal VRST to the low voltage level (e.g., pull-down) when the source voltage becomes lower than a reference voltage as the power source is turned off. The timing controller resetting circuit 550 may maintain the reset signal VRST to have the low voltage level before the source voltage becomes higher than the reference voltage as the power source is turned on. Thus, the timing controller resetting circuit 550 may effectively prevent a reset signal recognition failure of the timing controller 540, which can occur when the power source is repeatedly turned on and off in a short amount of time. As a result, the display device 500 may effectively prevent the timing controller 540 from malfunctioning due to the reset signal recognition failure of the timing controller 540. In an exemplary embodiment of the present inventive concept, the timing controller resetting circuit 540 may include a resistor connected between an output node from which the reset signal VRST is output and the power source which supplies the source voltage, a capacitor connected between the output node and a ground source which supplies a ground voltage, a reference voltage source that generates the reference voltage that is lower than the source voltage and higher than the ground voltage, a comparator including a first input terminal which receives the source voltage, a second input terminal which receives the reference voltage from the reference voltage source, and an output terminal which outputs a comparison result signal generated by comparing the source voltage with the reference voltage, and a transistor including a first terminal which is connected to the output node, a second terminal which receives the ground voltage, and a gate terminal which receives the comparison result signal from the comparator. In another exemplary embodiment of the present inventive concept, the timing controller resetting circuit 550 may include a resistor connected between an output node from which the reset signal VRST is output and the power source which supplies a source voltage, a capacitor connected between the output node and a ground source which supplies a ground voltage, a comparator including a first input terminal which receives the source voltage, a second input terminal which receives the reference voltage that is lower than the source voltage and higher than the ground voltage from an external source, and an output terminal which outputs a comparison result signal generated by comparing the source voltage with the reference voltage, and a transistor including a first terminal which is connected to the output node, a second terminal which receives the ground voltage, and a gate terminal which receives the comparison result signal from the comparator. Since a structure and an operation of respective exemplary embodiments of the timing controller resetting circuit 550 is described with reference to FIGS. 1 to 9, duplicated descriptions related thereto will not be repeated. In addition, although it is described above that the display device 500 includes the display panel 510, the scan driver 520, the data driver 530, the timing controller 540, the timing controller resetting circuit 550, and the emission control driver, in some exemplary embodiments of the present inventive concept, the display device 500 may include additional components (e.g., a deterioration compensating circuit for performing deterioration compensation on the pixel circuits P of the display panel 510, etc).

Figure 11:
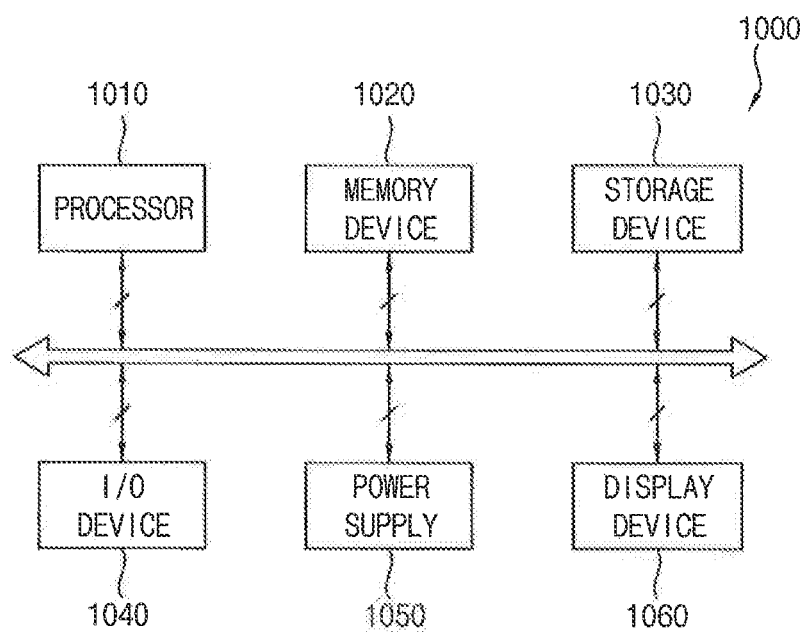
FIG. 11 is a block diagram illustrating an electronic device according to exemplary embodiments of the present inventive concept.
Figure 12A:
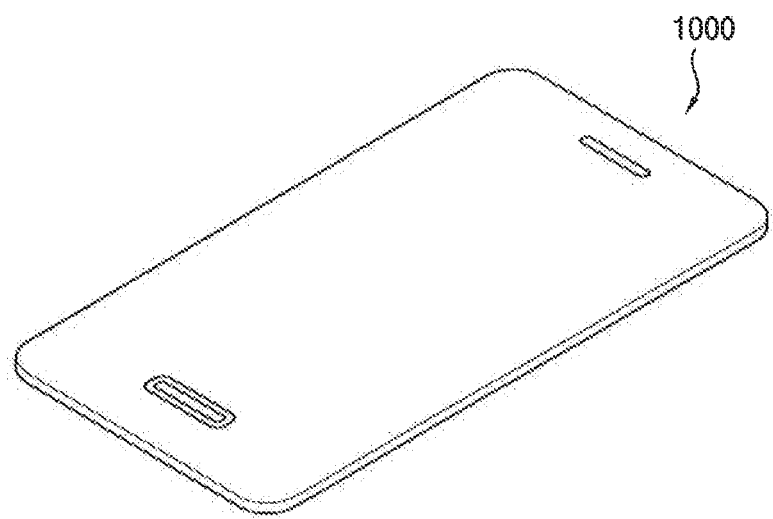
FIG. 12A is a diagram illustrating an example in which the electronic device of FIG. 11 is implemented as a smart phone.
Figure 12B:
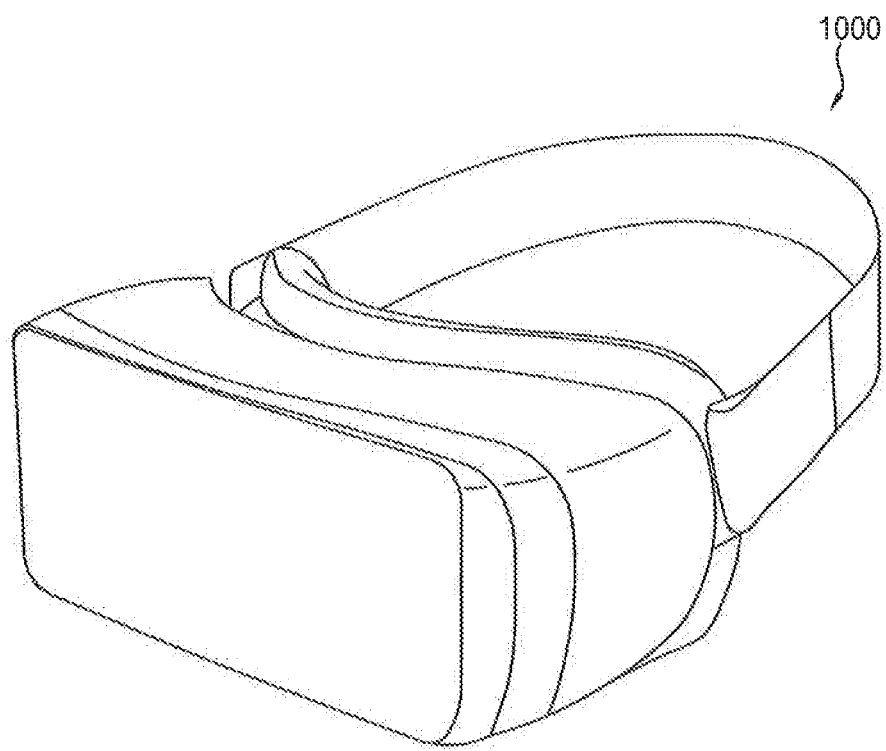
FIG. 12B is a diagram illustrating an example in which the electronic device of FIG. 11 is implemented as a head mounted display (HMD) device.

FIG. 11 is a block diagram illustrating an electronic device according to exemplary embodiments of the present inventive concept, FIG. 12A is a diagram illustrating an example in which the electronic device of FIG. 11 is implemented as a smart phone, and FIG. 12B is a diagram illustrating an example in which the electronic device of FIG. 11 is implemented as a head mounted display (HMD) device.

Referring to FIGS. 11 to 12B, the electronic device 1000 may include a processor 1010, a memory device 1020, a storage device 1030, an input/output (I/O) device 1040, a power supply 1050, and a display device 1060. For example, the display device 1060 may be the display device 500 of FIG. 10. In addition, the electronic device 1000 may further include a plurality of ports for communicating with a video card, a sound card, a memory card, a universal serial bus (USB) device, other electronic devices, etc. In an exemplary embodiment of the present inventive concept, as illustrated in FIG. 12A, the electronic device 1000 may be the smart phone. In another exemplary embodiment of the present inventive concept, as illustrated in FIG. 12B, the electronic device 1000 may be the HMD device. However, the electronic device 1000 is not limited thereto. For example, the electronic device 1000 may be a television, a cellular phone, a video phone, a smart pad, a smart watch, a tablet personal computer (PC), a car navigation system, a computer monitor, a laptop, etc.

The processor 1010 may perform various computing functions. The processor 1010 may be a micro processor, a central processing unit (CPU), an application processor (AP), etc. The processor 1010 may be coupled to other components via an address bus, a control bus, a data bus, etc. Further, the processor 1010 may be coupled to an extended bus such as a peripheral component interconnection (PCI) bus. The buses may be identified by the horizontally disposed block arrow in FIG. 11. The memory device 1020 may store data for operations of the electronic device 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 1030 may be a solid state drive (SSD) device, a hard disk drive (HDD) device, a compact disc read only memory (CD-ROM) device, etc. The I/O device 1040 may be an input device such as a keyboard, a keypad, a mouse device, a touchpad, a touch-screen, etc, and an output device such as a printer, a speaker, etc. In some exemplary embodiments of the present inventive concept, the display device 1060 may be included in the I/O device 1040. The power supply 1050 may provide power for operations of the electronic device 1000.

The display device 1060 may be coupled to other components via the buses or other communication links. As described above, the display device 1060 may include a display panel including a plurality of pixel circuits, a scan driver that provides a scan signal to the pixel circuits, a data driver that provides a data signal to the pixel circuits, a timing controller that controls the scan driver and the data driver, and a timing controller resetting circuit that receives a source voltage output from a power source and generates a reset signal based on the source voltage. In this configuration, the timing controller may decide whether to operate based on the reset signal received from the timing controller resetting circuit. The timing controller may generate, using the source voltage output from the power source, a plurality of control signals for controlling the scan driver and the data driver. For example, the timing controller may operate after the reset signal switches from a low voltage level to a high voltage level as the power source is turned on. The timing controller may not operate after the reset signal switches from the high voltage level to the low voltage level as the power source is turned off. In addition, the timing controller resetting circuit may drop the reset signal to the low voltage level (e.g., pull-down) when the source voltage becomes lower than a reference voltage as the power source is turned off. The timing controller resetting circuit may maintain the reset signal to have the low voltage level before the source voltage becomes higher than the reference voltage as the power source is turned on.

In an exemplary embodiment of the present inventive concept, a timing controller resetting circuit may include a resistor connected between an output node from which the reset signal is output and the power source which supplies a source voltage, a capacitor connected between the output node and a ground source which supplies a ground voltage, a reference voltage source that generates the reference voltage that is lower than the source voltage and higher than the ground voltage, a comparator including a first input terminal which receives the source voltage, a second input terminal which receives the reference voltage from the reference voltage source, and an output terminal which outputs a comparison result signal generated by comparing the source voltage with the reference voltage, and a transistor including a first terminal which is connected to the output node, a second terminal which receives the ground voltage, and a gate terminal which receives the comparison result signal from the comparator. In another exemplary embodiment of the present inventive concept, the timing controller resetting circuit may include a resistor connected between an output node from which the reset signal is output and the power source which supplies a source voltage, a capacitor connected between the output node and a ground source which supplies a ground voltage, a comparator including a first input terminal which receives the source voltage, a second input terminal which receives the reference voltage that is lower than the source voltage and higher than the ground voltage from an external source, and an output terminal which outputs a comparison result signal generated by comparing the source voltage with the reference voltage, and a transistor including a first terminal which is connected to the output node, a second terminal which receives the ground voltage, and a gate terminal which receives the comparison result signal from the comparator.

Exemplary embodiments of present inventive concept may be applied to a display device and an electronic device including the display device. For example, exemplary embodiments of the present inventive concept may be applied to a cellular phone, a smart phone, a video phone, a smart pad, a smart watch, a tablet PC, a car navigation system, a television, a computer monitor, a laptop, a digital camera, an HMD device, etc.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A timing controller resetting circuit, comprising:
   a resistor connected to an output node from which a reset signal is output and a first voltage source which supplies a first voltage;
   a capacitor connected to the output node and a second voltage source which supplies a second voltage that is lower than the first voltage;
   a reference voltage source configured to generate a reference voltage that is lower than the first voltage and higher than the second voltage;
   a comparator including a first input terminal which receives the first voltage, a second input terminal which receives the reference voltage, and an output terminal which outputs a comparison result signal generated by comparing the first voltage with the reference voltage; and
   a transistor including a first terminal which is connected to the output node, a second terminal which receives the second voltage which is a ground voltage and is connected to the capacitor, and a gate terminal which receives the comparison result signal.

2. The timing controller resetting circuit of claim 1, wherein the first voltage is a source voltage which is supplied from a power source, and the second voltage is the ground voltage which is supplied from a ground source.

3. The timing controller resetting circuit of claim 1, wherein the first input terminal of the comparator is a negative input terminal, the second input terminal of the comparator is a positive input terminal, and the transistor is an n-channel metal oxide semiconductor (NMOS) transistor.

4. The timing controller resetting circuit of claim 3, wherein the comparison result signal has a low voltage level when the first voltage is higher than the reference voltage, and the transistor is turned off when the comparison result signal has the low voltage level.

5. The timing controller resetting circuit of claim 3, wherein the comparison result signal has a high voltage level when the first voltage is lower than the reference voltage, and the transistor is turned on when the comparison result signal has the high voltage level.

6. The timing controller resetting circuit of claim 1, wherein the first input terminal of the comparator is a positive input terminal, the second input terminal of the comparator is a negative input terminal, and the transistor is a p-channel metal oxide semiconductor (PMOS) transistor.

7. The timing controller resetting circuit of claim 6, wherein the comparison result signal has a high voltage level when the first voltage is higher than the reference voltage, and the transistor is turned off when the comparison result signal has the high voltage level.

8. The timing controller resetting circuit of claim 6, wherein the comparison result signal has a low voltage level when the first voltage is lower than the reference voltage, and the transistor is turned on when the comparison result signal has the low voltage level.

9. A timing controller resetting circuit, comprising:
   a resistor connected to an output node from which a reset signal is output and a first voltage source which supplies a first voltage;
   a capacitor connected to the output node and a second voltage source which supplies a second voltage that is lower than the first voltage;
   a comparator including a first input terminal which receives the first voltage, a second input terminal which receives a reference voltage that is lower than the first voltage and higher than the second voltage, and an output terminal which outputs a comparison result signal generated by comparing the first voltage with the reference voltage; and
   a transistor including a first terminal which is connected to the output node, a second terminal which is connected to the capacitor and which receives the second voltage which is a ground voltage, and a gate terminal which receives the comparison result signal.

10. The timing controller resetting circuit of claim 9, wherein the first voltage is a source voltage which is supplied from a power source, and the second voltage is the ground voltage which is supplied from a ground source.

11. The timing controller resetting circuit of claim 9, wherein the first input terminal of the comparator is a negative input terminal, the second input terminal of the comparator is a positive input terminal, and the transistor is an n-channel metal oxide semiconductor (NMOS) transistor.

12. The timing controller resetting circuit of claim 11, wherein the comparison result signal has a low voltage level when the first voltage is higher than the reference voltage, and the transistor is turned off when the comparison result signal has the low voltage level.

13. The timing controller resetting circuit of claim 11, wherein the comparison result signal has a high voltage level when the first voltage is lower than the reference voltage, and the transistor is turned on when the comparison result signal has the high voltage level.

14. The timing controller resetting circuit of claim 9, wherein the first input terminal of the comparator is a positive input terminal, the second input terminal of the comparator is a negative input terminal, and the transistor is a p-channel metal oxide semiconductor (PMOS) transistor.

15. The timing controller resetting circuit of claim 14, wherein the comparison result signal has a high voltage level when the first voltage is higher than the reference voltage, and the transistor is turned off when the comparison result signal has the high voltage level.

16. The timing controller resetting circuit of claim 14, wherein the comparison result signal has a low voltage level when the first voltage is lower than the reference voltage, and the transistor is turned on when the comparison result signal has the low voltage level.

17. A display device, comprising:
a display panel including a plurality of pixel circuits;
a scan driver configured to provide a scan signal to the pixel circuits;
a data driver configured to provide a data signal to the pixel circuits;
a timing controller configured to control the scan driver and the data driver and to operate based on a reset signal; and
a timing controller resetting circuit configured to receive a source voltage output from a power source and to generate the reset signal based on the source voltage,
wherein the timing controller operates after the reset signal switches from a low voltage level to a high voltage level as the power source is turned on,
wherein the timing controller does not operate after the reset signal switches from the high voltage level to the low voltage level as the power source is turned off,
wherein the timing controller resetting circuit drops the reset signal to the low voltage level when the source voltage becomes lower than a reference voltage as the power source is turned off,
wherein the timing controller resetting circuit maintains the reset signal to have the low voltage level before the source voltage becomes higher than the reference voltage as the power source is turned on, and
wherein the timing controller resetting circuit comprises:
a resistor connected to an output node from which the reset signal is output and the power source;
a capacitor connected to the output node and a ground source which supplies a ground voltage;
a comparator including a first input terminal which receives the source voltage, a second input terminal which receives the reference voltage, and an output terminal which outputs a comparison result signal generated by comparing the source voltage with the reference voltage; and
a transistor including a first terminal which is connected to the output node, a second terminal which receives the ground voltage and is connected to the capacitor, and a gate terminal which receives the comparison result signal.

18. The display device of claim 17, wherein the timing controller generates, using the source voltage, a plurality of control signals for controlling the scan driver and the data driver.

19. The display device of claim 17, wherein the timing controller resetting circuit comprises:
a reference voltage source configured to generate the reference voltage, wherein the reference voltage is lower than the source voltage and higher than the ground voltage.

20. The display device of claim 17,
wherein the reference voltage is lower than the source voltage and higher than the ground voltage.

* * * * *